United States Patent

[11] 3,573,509

[72] Inventor Robert Hudson Crawford
Richardson, Tex.

[21] Appl. No. 758,283
[22] Filed Sept. 9, 1968
[45] Patented Apr. 6, 1971
[73] Assignee Texas Instruments Incorporated
Dallas, Tex.

[54] DEVICE FOR REDUCING BIPOLAR EFFECTS IN MOS INTEGRATED CIRCUITS
6 Claims, 5 Drawing Figs.

[52] U.S. Cl. .......... 307/303, 317/235, 307/304, 307/221
[51] Int. Cl. .......... H01l 19/00
[50] Field of Search .......... 330/38 (Fe); 307/205, 213, 251, 279; 317/235/21.2, 235/22, 235/22.1, 235/22.2; 307/303, 304

[56] References Cited
UNITED STATES PATENTS

| | | | |
|---|---|---|---|
| 3,383,570 | 5/1968 | Luscher | 317/235 |
| 3,408,511 | 10/1968 | Bergersen et al. | 317/235 |
| 3,427,445 | 2/1969 | Dailey | 317/235 |
| 3,430,110 | 2/1969 | Goshgarian | 317/235 |
| 3,395,292 | 7/1968 | Bogert | 307/279 |
| 3,423,650 | 1/1969 | Cohen | 317/235 |

*Primary Examiner*—Jerry D. Craig
*Attorneys*—Samuel M. Mims, Jr., James O. Dixon, Andrew M. Hassell, Harold Levine, Melvin Sharp, Gerald B. Epstein, John E. Vandigriff and Richards, Harris and Hubbard

ABSTRACT: A capacitive pullup, two-phase shift register formed by P-channel enhancement mode MOS transistors is disclosed as the embodiment of the invention. As a result of the capacitive coupling, a P-type diffusion which is normally negative will go positive in some instances. This forward biases the normally reverse biased PN junction between the P-type diffusion and the N-type substrate, injecting carriers into the substrate which may be collected at any other negatively biased P-type diffusion which then functions as the collector of a bipolar transistor. This collector current may result in the loss of stored logic information. To minimize these effects, a P-type collector diffusion is disposed adjacent to each potential emitting diffusion to collect the spurious carriers injected into the substrate before they cause the loss of stored data.

Patented April 6, 1971 3,573,509

2 Sheets-Sheet 1

INVENTOR:

ROBERT H. CRAWFORD

E Mickey Hubbard

ATTORNEY

INVENTOR:
ROBERT H. CRAWFORD
E. Mickey Hubbard
ATTORNEY

DEVICE FOR REDUCING BIPOLAR EFFECTS IN MOS INTEGRATED CIRCUITS

This invention relates generally to semiconductor devices, and more particularly relates to MOS integrated circuits.

In a typical integrated circuit of metal-oxide-semiconductor (MOS) field-effect transistors, the source and drain regions of the MOS transistors are formed by P-type diffusions made into an N-type substrate. In normal operation, these circuits are operated such that the diffused regions are negative with respect to the substrate and the PN junction between each diffused region and the substrate is always reverse biased. So long as all of the diffused regions remain negative with respect to the substrate, minority current cannot flow from one transistor device through the substrate to another. However, any two P-type diffusions together with the N-type substrate are potentially a PNP bipolar transistor, although it may be a relatively poor one. Thus, if any diffused area goes positive with respect to the substrate, minority carriers can be injected into the substrate, and current, in the nature of collector current, will potentially flow through the substrate to any available P-type diffused region which is at the same or a more negative potential than the substrate. In logic circuits which store logic data as negative charges on capacitors, this bipolar current can result in the loss of the negative charge, and thus the loss of logic data.

This invention is concerned with alleviating the adverse effects of this bipolar action. This is achieved by placing a diffused collector region adjacent each potential emitter region so that carriers injected into the substrate will tend to be collected by the collector region and dissipated harmlessly into another circuit. The collector region may be formed during the same diffusion process used to form the source and drain regions and thus require no additional processing steps. Although the collector regions preferably extend around the potential emitter region, the collector region is effective if merely placed in close proximity to the potential emitter region. In accordance with a more specific aspect of the invention, each half bit of a multiple phase, capacitive pullup shift register is separated by a grounded collector diffusion.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawings, wherein:

Figure 1:
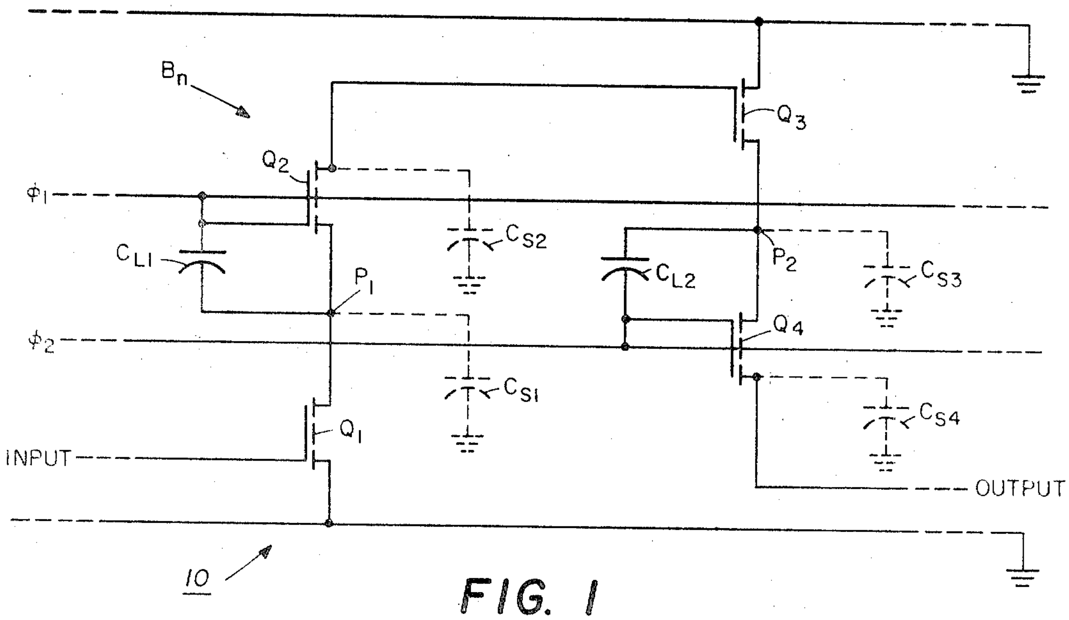
FIG. 1 is a schematic circuit diagram of one bit of a shift register in accordance with the prior art.

Referring now to the drawings, one bit $B_n$ of a shift register embodying the present invention is indicated generally by the reference numeral 10 in FIG. 1. The shift register is of the type described in detail and claimed in copending U.S. Pat. application Ser. No. 685,238 which typically has 50 bits. Of course, the number of bits is merely a matter of choice. Bit $B_n$ is typical and will now be described.

Bit $B_n$ is comprised of first and second identical synchronous inverter stages. The first stage is comprised of a driver MOSFET $Q_1$ and a load capacitance $C_{L1}$ which are connected in series. The gate of the driver transistor $Q_1$ is a logic input of the first inverter stage and therefore of bit $B_n$. An output MOSFET $Q_2$ connects the junction between the load capacitance $C_{L1}$ and the driver $Q_1$ to the output of the first stage. The output of the first stage is connected to the gate of the driver $Q_3$ of the second stage. The driver $Q_3$ is connected in series with a load capacitance $C_{L2}$, and an output MOS transistor $Q_4$ connects the junction between the load capacitance $C_{L2}$ and the driver $Q_3$ to the output of the second inverter stage which may be considered as the output of bit $B_n$. The logic output of each bit is connected to the logic input of the next successive bit as represented by the dotted lines. In accordance with the broader aspects of this invention, the MOSFETs may be either N-channel or P-channel devices. However, it is hereafter assumed that all devices are P-channel to simplify the disclosure and the drawings, it being understood that the two types of MOS devices are essentially identical in operation except for the polarity of the bias voltages.

Figure 2:
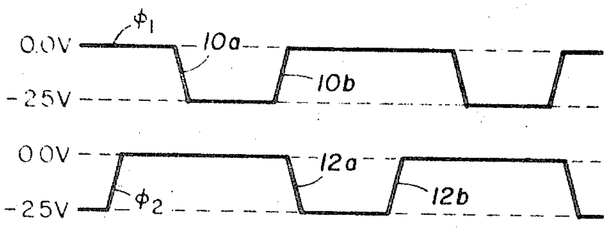
FIG. 2 is a plot of voltage with respect to time of the clock pulses for operating the shift register of FIG. 1.

The nonconcurrent clock pulses $\Phi_1$ and $\Phi_2$ shown in FIG. 2 supply power to the inverters of the shift register. Clock pulses $\Phi_1$ are applied to the terminals designated $\Phi_1$, and clock pulses $\Phi_2$ are applied to the terminals designated $\Phi_2$. It will be noted that the first clock pulse $\Phi_1$ is applied across the load capacitance $C_{L1}$ and the driver $Q_1$ of the first stage of each bit, and to the gate of the output transistor $Q_2$ of the first stage of each bit. The second clock pulse $\Phi_2$ is applied across the series circuit including the load capacitance $C_{L2}$ and the driver $Q_3$ of each second stage, and to the gate of the output transistor $Q_4$ of each second stage.

In the operation of the shift register bit $B_n$, the typical logic 0 level is 0.0 volt and the typical logic 1 level is −12.0 volts. The clock pulses $\Phi_1$ and $\Phi_2$ typically fall from 0.0 volt to −25.0 volts. The threshold voltage of the MOS transistors is typically −3.0 to −5.0 volts. Assume that a logic 0 level of 0.0 volt is applied to the gate of driver $Q_1$ prior to the fall 10*a* of clock pulse $\Phi_1$. Since no potential is applied across the load capacitor $C_{L1}$, the capacitance and the stray capacitance $C_{S1}$ of the circuit are discharged. When clock voltage $\Phi_1$ falls at 10*a* at a high rate, typically 10 to 50 nanoseconds, node $P_1$ goes negative at substantially the same rate because the gate of driver $Q_1$ was assumed to be at 0.0 volt and is therefore turned "off" and the stray capacitance $C_{S1}$ is directly charged. The load capacitance $C_{L1}$ and the stray capacitance $C_{S1}$ form a capacitor voltage divider. When the voltage on the gate of output transistor $Q_2$ reaches the threshold voltage, the output transistor turns "on" so that the voltage at node $P_1$ is transferred to the stray capacitance $C_{S2}$ through the very low resistance of transistor $Q_2$. The stray capacitance represented by $C_{S2}$ is the stray capacitance of the PN junction of output transistor $Q_2$ and the capacitance of the gate of the driver transistor $Q_3$ of the second inverter stage. During the rise 10*b* of the first clock pulse $\Phi_1$, output transistor $Q_2$ turns "off" so that the voltage charge on stray capacitance $C_{S2}$ is trapped at a level typically on the order of about −10.0 to −12.0 volts. The gate of the driver transistor $Q_3$ of the second stage is then biased more negatively than its threshold level so that it will turn "on" during the fall 12*a* of the clock pulse $\Phi_2$. Thus, as clock pulse $\Phi_2$ falls, node $P_2$ remains substantially at ground potential. As output transistor $Q_4$ is turned "on" during clock pulse $\Phi_2$, any charge on stray capacitance $C_{S2}$ from the previous cycle is discharged so that a logic 0 is applied to the input of the next successive bit.

On the other hand, if the gate of driver $Q_1$ is at a logic 1 level of about −12.0 volts prior to the fall 10*a* of clock pulse $\Phi_1$, transistor $Q_1$ is biased "on" during clock pulse $\Phi_1$ so that node $P_1$ remains substantially at zero potential and stray capacitance $C_{S2}$ of the first stage is discharged while transistor $Q_2$ is "on". Transistor $Q_3$ then remains "off" during clock pulse $\Phi_2$ so that stray capacitance $C_{S2}$ of the second stage is charged negatively to a logic 1 level. Thus, in two clock pulses, i.e., one clock cycle, either a logic 1 or a logic 0 is shifted from the input to the output of the bit.

The transistors $Q_1$—$Q_4$ of bit $B_n$ are formed by P-type diffused regions in an N-type substrate, together with a silicon dioxide insulating layer and a metal gate electrode. As a result, a PNP bipolar transistor is potentially formed by any two of the diffused P-type regions and the N-type substrate. These potential bipolar transistors are represented in dotted line in FIG. 3 as transistors 14, 16, 18 and 20. When clock pulse $\Phi_1$ makes a positive going transition at 10*b*, node $P_1$, which is a P-type diffusion, can go positive with respect to ground, and thus with respect to the N-type substrate which is also at ground. On the other hand, the drain diffusions of transistors $Q_2$ and $Q_4$ may be negative with respect to ground as a result of a negative voltage being stored on the stray capacitances $C_{S2}$ and $C_{S4}$. As a result, either of the bipolar transistors 14 or 16 may conduct collector current because the emitters are forward biased and the collectors are either at ground or are negative biased. As a result of the conduction of bipolar transistors 14 and 16, the negative charges on capacitors $C_{S2}$ and $C_{S4}$, which are representative of logic data, may be lost. A similar situation exists with respect to node $P_2$, During the rise *12b* of clock pulse $\Phi_2$, node $P_2$ may go positive, causing conduction of either of bipolar transistors 18 or 20. These adverse effects are largely remedied in the circuit illustrated in FIGS. 4 and 5 which incorporate the present invention.

Figure 4:
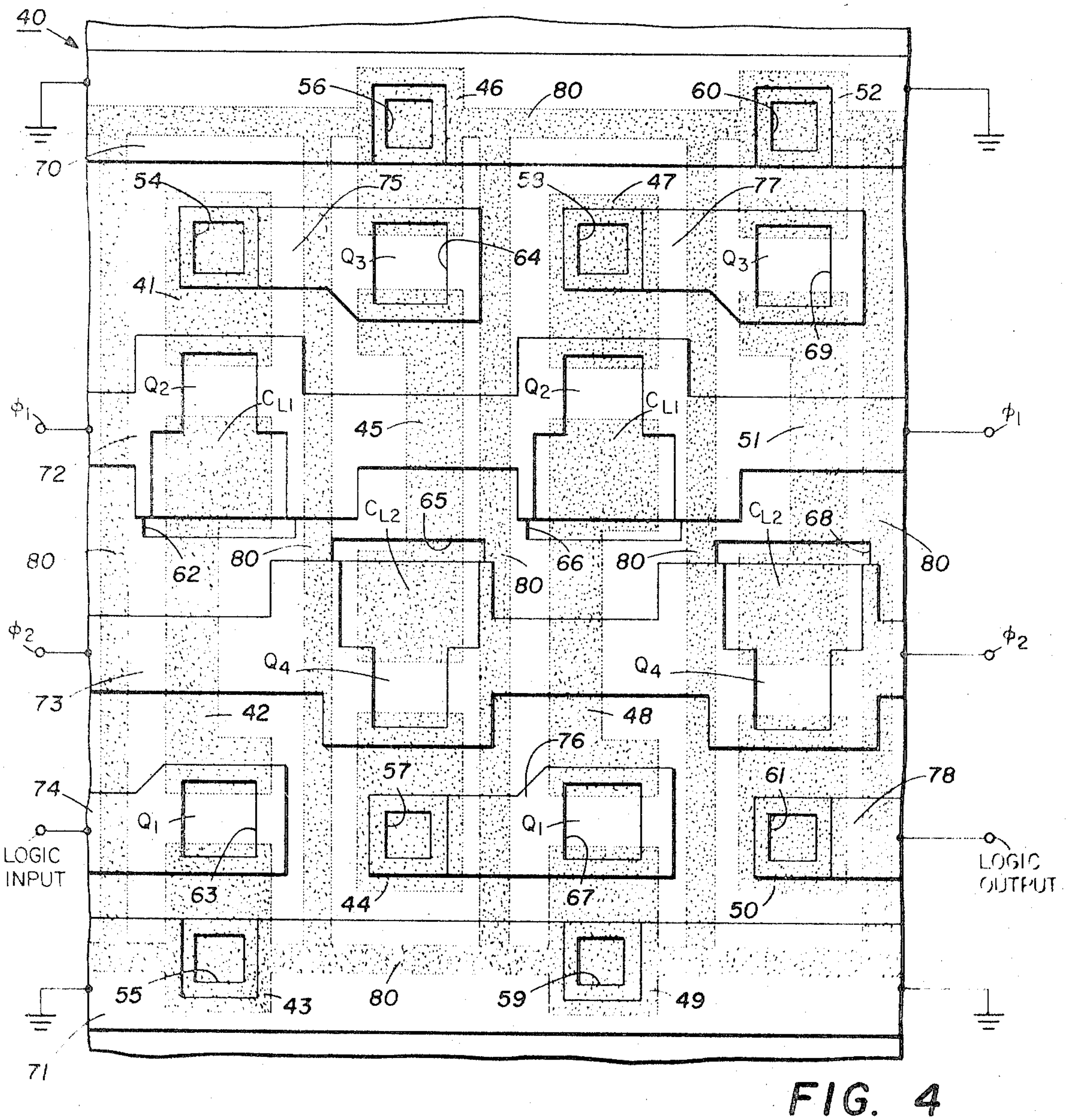
FIG. 4 is a plan view of two bits of a shift register incorporating the present invention.

Referring now to FIG. 4, two bits of a shift register embodying the present invention are incorporated in the integrated circuit indicated generally by the reference numeral 40. The integrated circuit 40 is typically formed on the surface of an N-type silicon substrate that is parallel to the (110) crystallographic surface (as defined by the Miller index system) into which a single P-type diffusion is made in the stippled areas 41—52. An oxide layer is formed over the entire surface of the semiconductor substrate except in areas 54—61. The silicon dioxide layer is typically about 15,000 angstroms thick everywhere except in the areas 62—69 where active MOS transistors or MOS capacitors are to be formed where the oxide is only about 1,000 angstroms thick. In addition, the oxide is only about 1,000 angstroms thick around each of the openings 54—61 due to the fabrication process. A metallized layer, typically aluminum, is deposited over the surface of the oxide and over the exposed surface of the substrate and then patterned to form ground leads 70 and 71, clock leads 72 and 73 for clock pulses $\Phi_1$ and $\Phi_2$, respectively, and interconnections 74—78.

Figure 5:
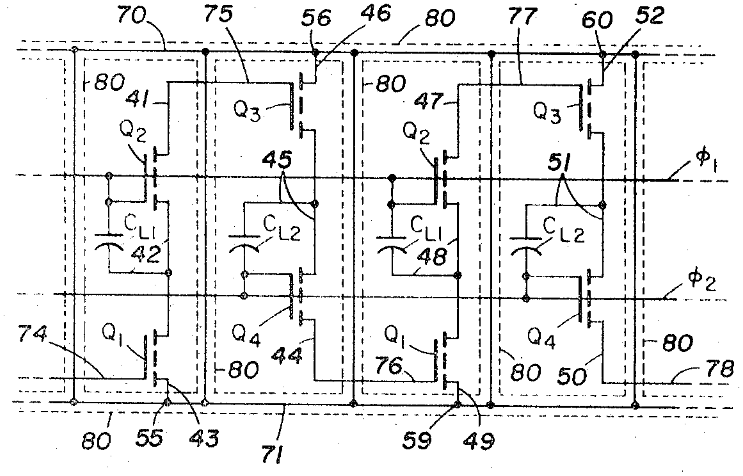
FIG. 5 is a schematic circuit diagram of that portion of the shift register shown in FIG. 4.

The channel of driver $G_1$ of the first bit is thus formed between diffused regions 42 and 43 under the thin oxide area 63, with the overlying portion of metal interconnection 74 forming the gate. Diffusion 42 forms one plate of the load capacitance $C_{L1}$, the thin oxide in area 62 forms the dielectric, and the metal lead 72 forms the other plate. The channel of output transistor $Q_2$ is formed between diffused regions 41 and 42 under the thin oxide in area 62, and metal lead 72 forms the gate. Ground lead 71 is in ohmic contact with diffused region 43 through opening 55 in the oxide layer, and interconnection 75 is in ohmic contact with diffused region 41 through opening 54 in the oxide. The other end of interconnection 75 forms the gate of transistor $Q_3$. The schematic circuit shown in FIG. 5 is representative of the two successive bits of the shift register shown in FIG. 4, and the components are arranged in substantially the same manner as the corresponding components of the integrated circuit 40, and are designated by the same reference characters.

Figure 3:
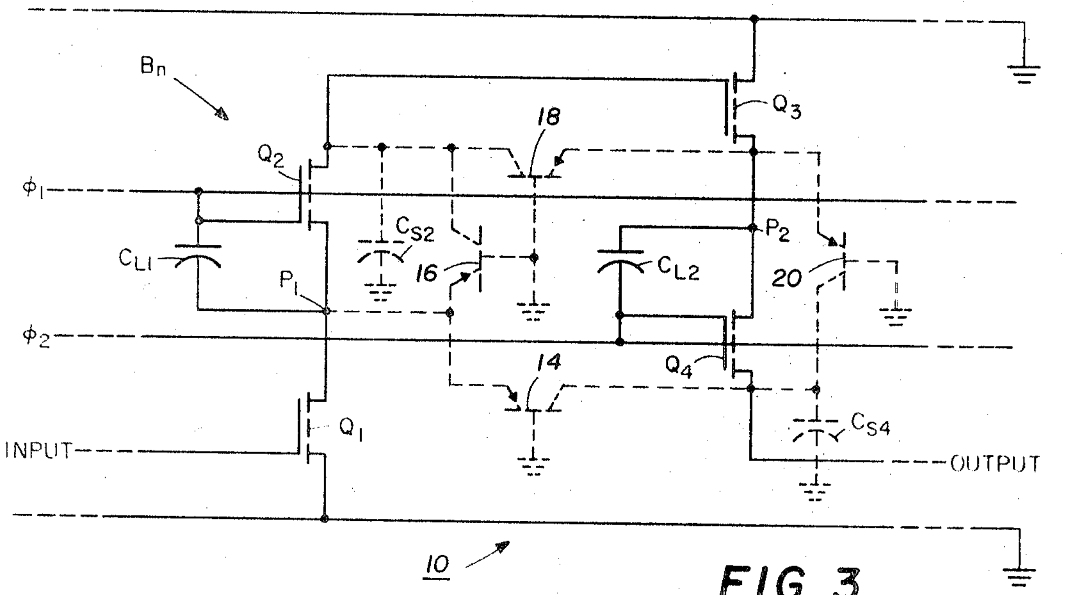
FIG. 3 is a schematic circuit diagram of one bit of the shift register shown in FIG. 1 which serves to illustrate the adverse effects of bipolar transistor action.

Relating the device shown in FIG. 4 to the schematic diagram of FIG. 3, the bipolar transistor 14 is formed between diffused regions 42 and 44, bipolar transistor 16 is formed between diffused regions 42 and 41, bipolar transistor 18 is formed between diffused regions 45 and 41, and bipolar transistor 20 is formed between diffused regions 45 and 44. Of course, the bipolar transistors illustrated in FIG. 3 are merely examples, it being appreciated that a bipolar transistor can be formed by any two P-type diffused regions anywhere on the substrate.

In accordance with the present invention, the adverse effects of these bipolar transistors are reduced to a tolerable level by P-type diffused collector regions 80 which are actually merely extensions of the diffused source regions 43, 46, 49 and 52 which are connected to ground. These P-type diffused regions act as collectors for any carriers injected into the substrate by a positively biased diffused region. It is convenient to form the diffused collector regions 80 completely around each half bit of the shift register. This results in the interposition of a collector region directly between the emitters and collectors of transistors 14 and 18 which significantly reduces the flow of current between diffused regions 42 and 44. Although the diffused collector regions 80 cannot be disposed between the emitter and collector of transistor 16 without interfering with the operation of transistor $Q_2$, the location of the diffused collector region 80 adjacent to these two diffused regions 41 and 42 reduces the current flow through transistor 16 to a tolerable level. Thus, while it is desirable to position the collector diffusion between the emitter and collector of the troublesome bipolar transistor, the collector diffusions are effective when placed so as to be merely an alternative current path. It will also be appreciated that although the diffused collector regions 80 are illustrated as grounded, these diffused regions may also be separated from the grounded source regions and made negative with respect to ground in order to enhance their carrier collecting capability.

Although the invention has been described in connection with a specific novel embodiment, it is to be understood that it has broad application in MOS circuits generally. In its broader aspects, the invention may be used in connection with both P-channel and N-channel devices. Thus, although a preferred embodiment has been described, it is to be understood that the scope of the invention is limited only by the appended claims.

I claim:

1. An integrated circuit comprising a plurality of cells comprising first, second, and third diffused regions of one conductivity type arranged serially in a substrate of another conductivity type; a fourth diffused region of said one conductivity type at least partially surrounding said first, second, and third diffused regions; and an oxide layer formed over all of said diffused regions except for end portions of said first and third diffused regions; and a patterned metal film overlying portions of said oxide layer, ohmically connected to said exposed end portions of said first and third diffused regions, whereby said first and second diffused regions define a first channel of a first field effect transistor and a portion of the metal film defines a gate electrode therefor, said second and third diffused regions define a second channel of a second field effect transistor in series connection with said first field effect transistor and a portion of the metal film defines a gate electrode therefor, a portion of said metal film forming with said second diffused region a capacitor, and means for biasing said fourth diffused region thereby forming a collector region for collection spurious carriers injected into said substrate.

2. An integrated circuit as defined in claim 1 wherein said fourth diffused region is an integral with and an extension of said first diffused region and completely surrounding said second and third diffused regions.

3. An integrated circuit as defined in claim 2 wherein said substrate is N-type, the diffused regions are P-type and the field effect transistors are enhancement mode P-channel devices.

4. An integrated circuit as defined in claim 2 wherein said substrate is P-type, the diffused regions are N-type and the field-effect transistors are N-channel enhancement mode devices.

5. An integrated circuit as defined in claim 2 and further including a plurality of cells comprising fifth, sixth and seventh diffused regions defining with said oxide and said metal film third and fourth field effect transistors and a second capacitor and a portion of said fourth diffused region is interposed between said first, second, and third diffused regions and said fifth, sixth, and seventh diffused regions.

6. An integrated circuit as defined in claim 5 wherein said transistors and capacitors are connected together by said metal film to form a 2-phase, capacitive pullup shift register.